(12) United States Patent
New

(10) Patent No.: US 6,528,429 B2
(45) Date of Patent: Mar. 4, 2003

(54) METHODS OF ETCHING INSULATIVE MATERIALS, OF FORMING ELECTRICAL DEVICES, AND OF FORMING CAPACITORS

(75) Inventor: Daryl C. New, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/978,489

(22) Filed: Oct. 15, 2001

(65) Prior Publication Data

US 2002/0025680 A1 Feb. 28, 2002

Related U.S. Application Data

(63) Continuation of application No. 09/360,869, filed on Jul. 23, 1999, now Pat. No. 6,358,857.

(51) Int. Cl.[7] .............................................. H01L 21/302
(52) U.S. Cl. ...................... 438/714; 438/720; 438/725; 438/712; 438/717; 216/61; 216/71; 216/72; 216/76
(58) Field of Search ............................... 216/71, 72, 76, 216/6; 438/714, 720, 725, 717, 712

(56) References Cited

U.S. PATENT DOCUMENTS

| | | |
|---|---|---|
| 5,098,860 A | 3/1992 | Chakravorty et al. |
| 5,337,207 A | 8/1994 | Jones et al. |
| 5,380,704 A | 1/1995 | Tarutani et al. |
| 5,561,075 A | 10/1996 | Nakazawa |
| 5,792,593 A | 8/1998 | McClure et al. |
| 5,840,200 A | 11/1998 | Nakagawa et al. |
| 5,889,289 A | 3/1999 | Cukauskas et al. |
| 5,930,639 A | 7/1999 | Schuele et al. |
| 6,177,351 B1 * | 1/2001 | Beratan et al. ............. 438/694 |

FOREIGN PATENT DOCUMENTS

| | | |
|---|---|---|
| JP | 03-009517 | 1/1991 |
| JP | 05-013260 | 1/1993 |
| JP | 07-161931 | 6/1995 |
| JP | 07-221197 | 8/1995 |

OTHER PUBLICATIONS

"Sputter Depth Profiling Analysis of $Ta_2O_5$ on Si Without Preferential Sputtering By Energetic Oxygen Ion Beams"; Moon et al.; Appl. Phys. Lett. (1993); 62 (24); pp. 3094–3096.*

Stanley Wolf et al.; "Dry Etching Various Types of Thin Films"; Silicon Processing for the VLSI Era, vol. 1, 1986; p. 555.

Stanley Wolf et al.; "Etch Gases Used for Various Integrated Circuit Materials"; Silicon Processing for the VLSI Era, vol. 1, 1986; p. 581.

McClure, D. J. et al.; "Reactive sputter sectioning: A tool for polymer film analysis"; J. Vac. Sci. Technol. A: 6(3), abstract, May 1988, 1 page.

* cited by examiner

Primary Examiner—George Goudreau
(74) Attorney, Agent, or Firm—Wells St. John P.S.

(57) ABSTRACT

In one aspect, the invention encompasses a method of etching insulative materials which comprise complexes of metal and oxygen. The insulative materials are exposed to physical etching conditions within a reaction chamber and in the presence of at least one oxygen-containing gas. In another aspect, the invention encompasses a method of forming a capacitor. An electrically conductive first layer is formed over a substrate, and a second layer is formed over the first layer. The second layer is a dielectric layer and comprises a complex of metal and oxygen. A conductive third layer is formed over the second layer. The first, second and third layers are patterned into a capacitor construction. The patterning of the second layer comprises exposing the second layer to at least one oxygen-containing gas while also exposing the second layer to physical etching conditions.

17 Claims, 5 Drawing Sheets

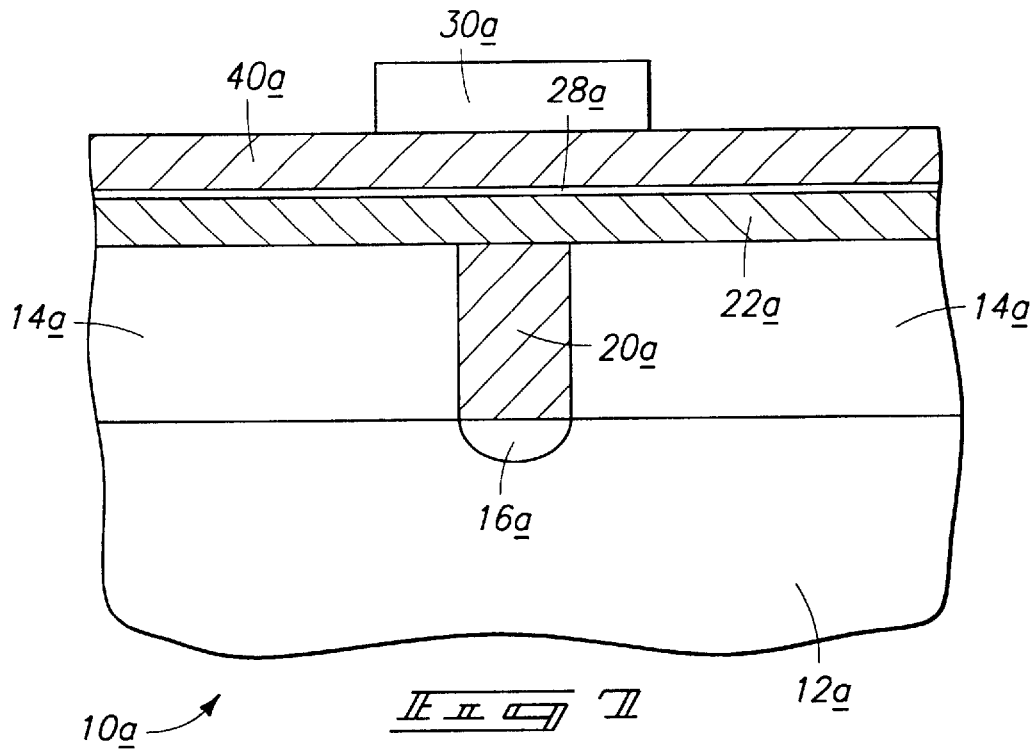
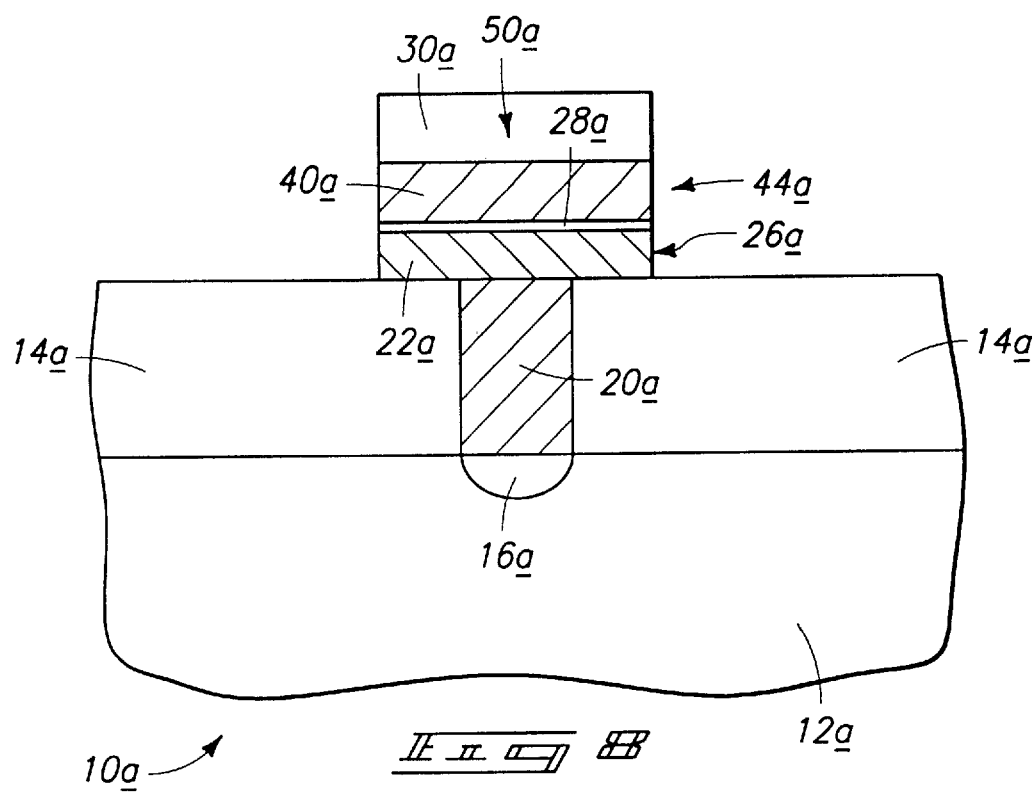

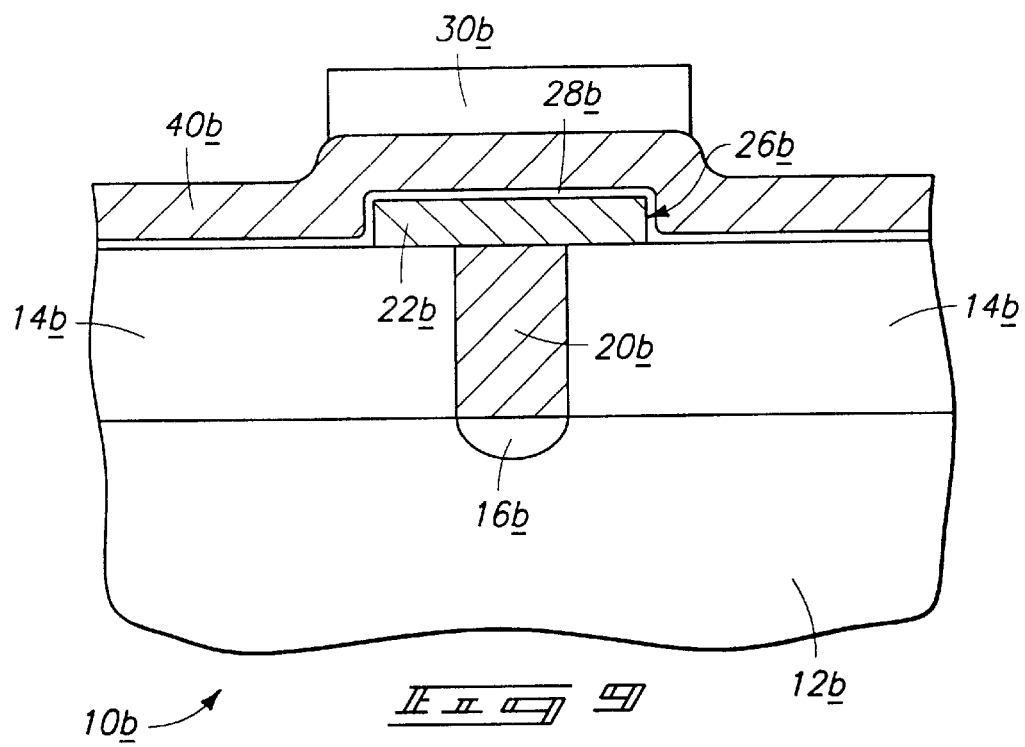
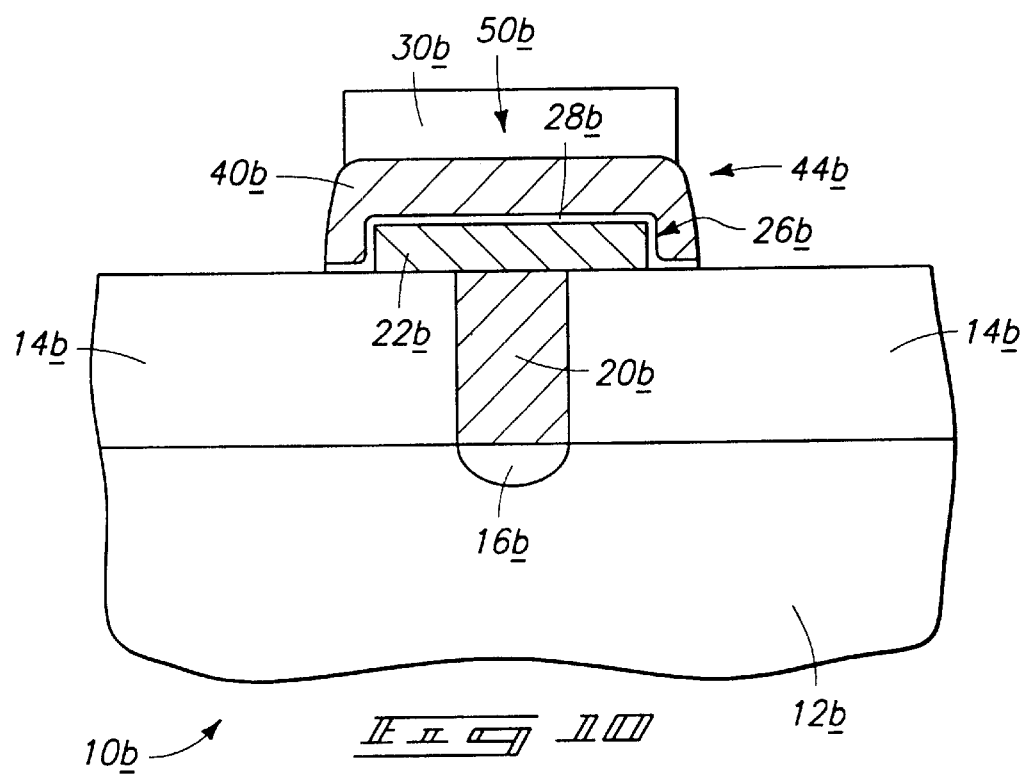

METHODS OF ETCHING INSULATIVE MATERIALS, OF FORMING ELECTRICAL DEVICES, AND OF FORMING CAPACITORS

This is a continuation of Application Ser. No. 09/360,869, filed Jul. 23, 1999, now U.S. Pat. No. 6,358,857.

TECHNICAL FIELD

The invention pertains to methods of etching insulative materials, and in particular embodiments pertains to methods of forming electrical devices, such as, for example, methods of forming capacitors.

BACKGROUND OF THE INVENTION

Semiconductor device fabrication frequently comprises removal of materials by etching. Etching methods can be divided into three general categories. A first category comprises so-called chemical etching, wherein an etchant gas chemically reacts with a material which is to be removed to convert such material to a form which can be readily removed. Another type of etching is so-called physical etching, wherein a material is bombarded with particles which displace the material. The bombarding particles are non-reactive with the material, and accordingly displace the material through purely physical interactions. Such physical etchant processes are sometimes referred to as "ion-milling". The third category of etching comprises a combination of physical and chemical etching. An etching gas is provided which comprises some components that chemically react with the material which is to be etched to form a modified material. The gas also comprises components which are non-reactive with either the material which is to be etched or the modified material, but which displace the one or both of the material which is to be etched and the modified material through physical interactions.

It is noted that any one of the three categories of etching processes discussed above (i.e., the chemical, physical, or combined chemical/physical processes) can be conducted in the presence of plasma, and that the physical etches are typically conducted in the presence of plasma In another aspect of the prior art, a number of materials have been introduced for semiconductor electronic device fabrication which are difficult to etch with anything but physical etch processes. Such materials include, for example, platinum and palladium. Platinum and palladium have been used for, for example, electrodes in capacitor constructions. Other materials utilized in capacitor constructions are dielectric materials, such as, for example, silicon dioxide, silicon nitride tantalum pentoxide, barium strontium oxide, and strontium bismuth tantalate. Dielectric materials can be, for example, chosen from the group consisting of $Ba_{(1-x)}Sr_xO_3$, $PbZr_{(1-x)}Ti_xO_3$, PZT with various dopants such as LA etc., $Sr_{(1-x)}Bi_xTaO_3$, $Sr_{(1-x)}Bi_xTiO_3$ and all of the other Smolenski compounds, $PbMg_{(1-x)}Nb_xTiO_3$ (PMN), compounds with $PbTiO_3$ (PMN—PT), $CaBi_2Nb_2O_9$, $SrBi_2Nb_2O_9$, $BaBi_2Nb_2O_9$, $PbBi_2Nb_2O_9$, $BaBi_2NbTiO_9$, $BaBi_4Ti_4O_{15}$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $PbBi_4Ti_4O_{15}$, $(Pb, Sr)Bi_2Nb_2O_9$, $(Pb, Ba)Bi_2Nb_2O_9$, $(Ba, Ca)Bi_2Nb_2O_9$, $(Ba, Sr)Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{1.25}O_9$, $Bi_3TiNbO_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $Bi_3TiNbO_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{1.5}$, and $Bi_5Ti_3GaO_{15}$.

Several of the dielectric materials being utilized for capacitor constructions, or being proposed for utilization in capacitor constructions, correspond to complexes of metal and oxygen, such as, for example, tantalum pentoxide, barium strontium oxide, etc. Such complexes can have advantages over more traditional materials, such as, for example, silicon dioxide or silicon nitride, in that the complexes of metal and oxygen can comprise higher dielectric constants than the traditional complexes.

Problems are occasionally encountered during etching of materials, such as, for example, during etching of metal and oxygen complexes. Accordingly, it would be desirable to develop new etching methods for utilization in semiconductor device fabrication.

SUMMARY OF THE INVENTION

In one aspect, the invention encompasses a method of etching insulative materials which comprise complexes of metal and oxygen. The insulative materials are exposed to physical etching conditions within a reaction chamber and in the presence of at least one oxygen-containing gas.

In another aspect, the invention encompasses a method of forming a capacitor. An electrically conductive first layer is formed over a substrate, and a second layer is formed over the first layer. The second layer is a dielectric layer and comprises a complex of metal and oxygen. A conductive third layer is formed over the second layer. The first, second and third layers are patterned into a capacitor construction. The patterning of the second layer comprises exposing the second layer to at least one oxygen-containing gas while also exposing the second layer to physical etching conditions.

BRIEF DESCRIPTION OF THE DRAWINGS

Preferred embodiments of the invention are described below with reference to the following accompanying drawings.

FIG. 7 is a diagrammatic, fragmentary, cross-sectional view of a semiconductor wafer fragment at a preliminary step of a second embodiment capacitor fabrication process encompassed by the present invention.

FIG. 8 is a view of the FIG. 7 wafer fragment shown at a processing step subsequent to that of FIG. 7.

FIG. 9 is a diagrammatic, fragmentary, cross-sectional view of a semiconductor wafer fragment shown at an initial step of a third embodiment capacitor-forming process encompassed by the present invention.

FIG. 10 is a view of the FIG. 9 wafer fragment shown at a processing step subsequent to that of FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
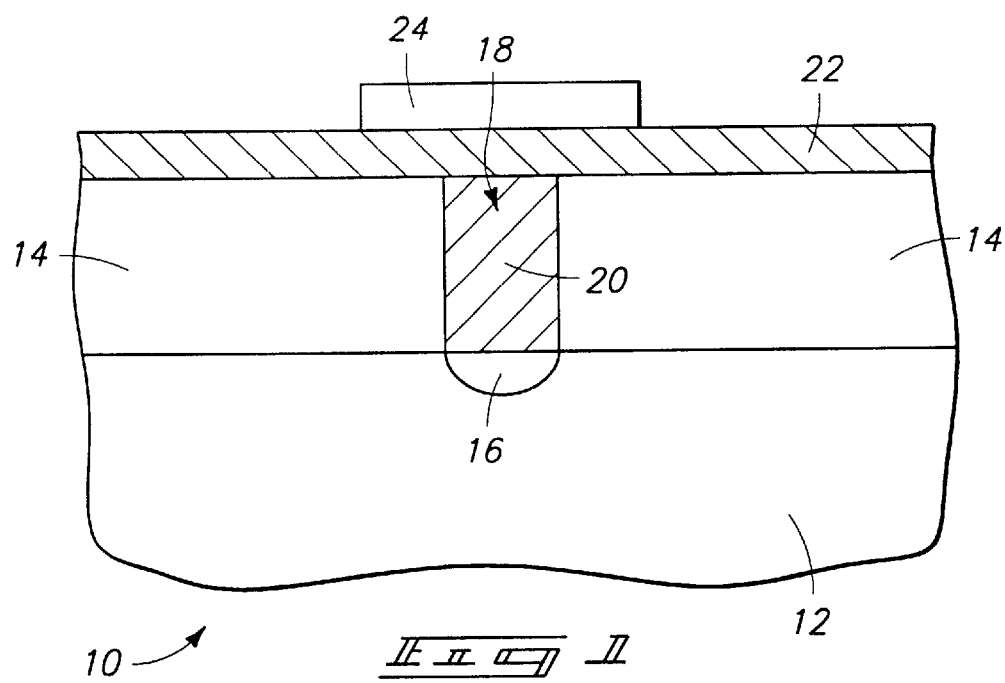
FIG. 1 is a diagrammatic, cross-sectional, fragmentary view of a semiconductor wafer fragment shown at an initial processing step of a capacitor-forming method of the present invention.

A first embodiment method encompassed by the present invention is described with reference to FIGS. 1–7 as a method for forming a capacitor construction. Referring initially to FIG. 1, a semiconductor wafer fragment 10 is illustrated at a preliminary step of the method. Wafer fragment 10 comprises a substrate 12. Substrate 12 can comprise, for example, a semiconductive material, such as monocrystalline silicon. Such semiconductive material can be lightly doped with a conductivity-enhancing dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative material 14 is formed over substrate 12. Insulative material 14 can comprise, for example, borophosphosilicate glass (BPSG), and can be formed by, for example, chemical vapor deposition. An electrical node 16 is formed within substrate 12, and in the shown embodiment comprises a conductively-doped diffusion region. An opening 18 extends through insulative material 14 to node 16, and a conductive material 20 is formed within opening 18. Conductive material 20 can comprise, for example, an elemental metal, a metal alloy, and/or conductively doped polysilicon.

A conductive material 22 is formed over insulative material 14, and in electrical connection with material 20. Material 20 thus defines so an electrical connection between conductive material 22 and node location 16. Conductive material 22 is ultimately to be patterned into a storage node for a capacitor construction and can comprise, for example, platinum or palladium. Among the materials suitable for conductive material 22 are: TiPt, TiNPt, TiAN—Pt, Ru, $RuO_2$, RuPt, $RuO_2Pt$, W, WPt, WSi, Ti, TiSi, Ta, TaN, TaSi, doped and undoped Poly Si, Al, Pd and Ir.

A masking material 24 is provided over conductive material 22. Masking material 24 can comprise, for example, photoresist. Masking material 24 is shown in the configuration of a patterned block, and can be formed into such configuration by, for example, photolithographic processing of photoresist with a patterned beam of light.

Figure 2:
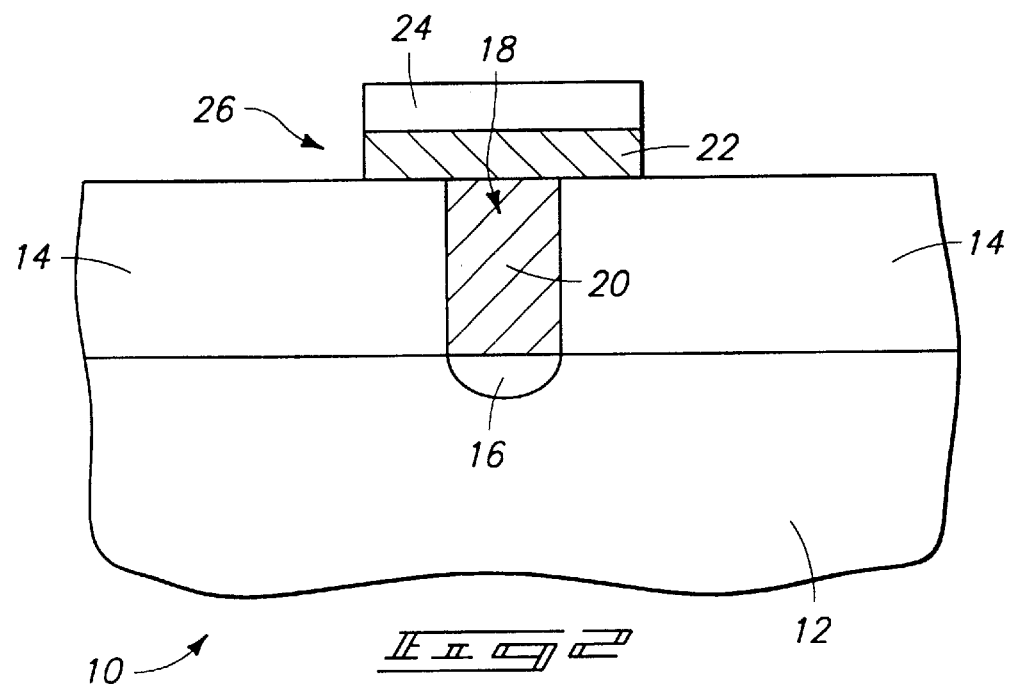
FIG. 2 is a view of the FIG. 1 wafer fragment shown at a processing step subsequent to that of FIG. 1.

Referring to FIG. 2, fragment 10 is shown after material 22 has been exposed to etching conditions. Such etching conditions can vary depending on the chemical composition of material 22. The etching can, for example, comprise a physical etch. An exemplary physical etch utilizes argon to bombard and displace portions of material 22 which are not protected by masking material 24. The etching of material 22 patterns such material into a first capacitor electrode 26.

Figure 3:
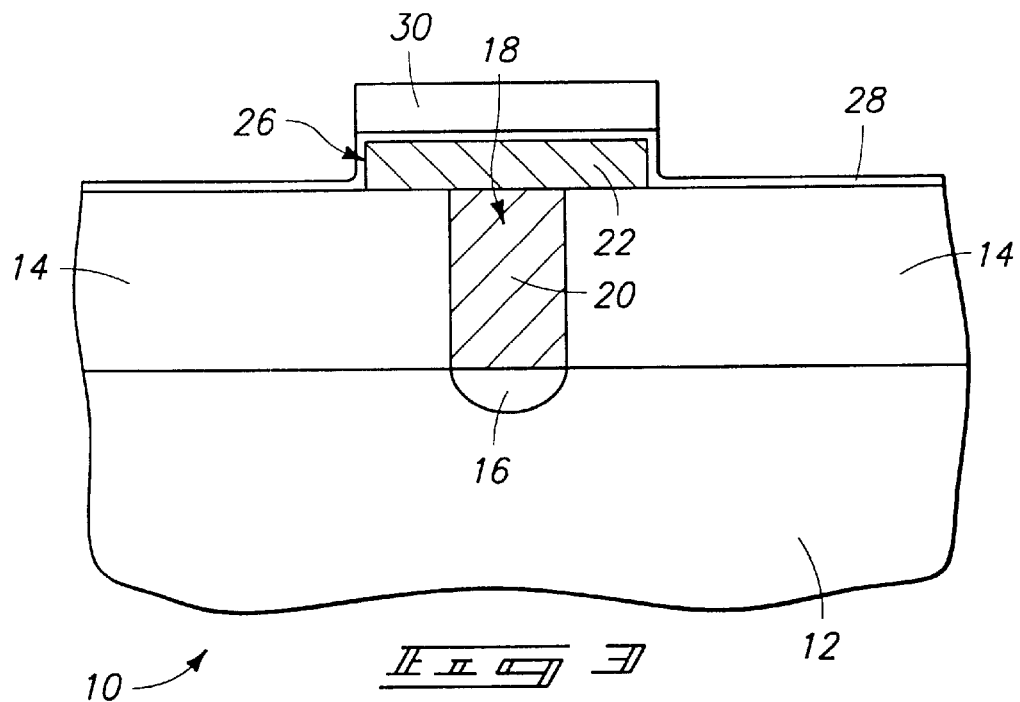
FIG. 3 is a view of the FIG. 1 wafer fragment shown at a processing step subsequent to that of FIG. 2.

Referring to FIG. 3, masking layer 24 is removed and a dielectric material 28 is formed over storage node 26. Dielectric material 28 can comprise, for example, a complex comprising metal and oxygen. Exemplary dielectric materials comprising metal and oxygen are described in the "Background" section of the this disclosure, and include tantalum pentoxide and barium strontium oxide. Alternatively, material 28 can comprise silicon dioxide or silicon nitride.

A second patterned masking material 30 is formed over dielectric material 28 and utilized to mask a portion of material 28 during a subsequent etch.

Figure 4:
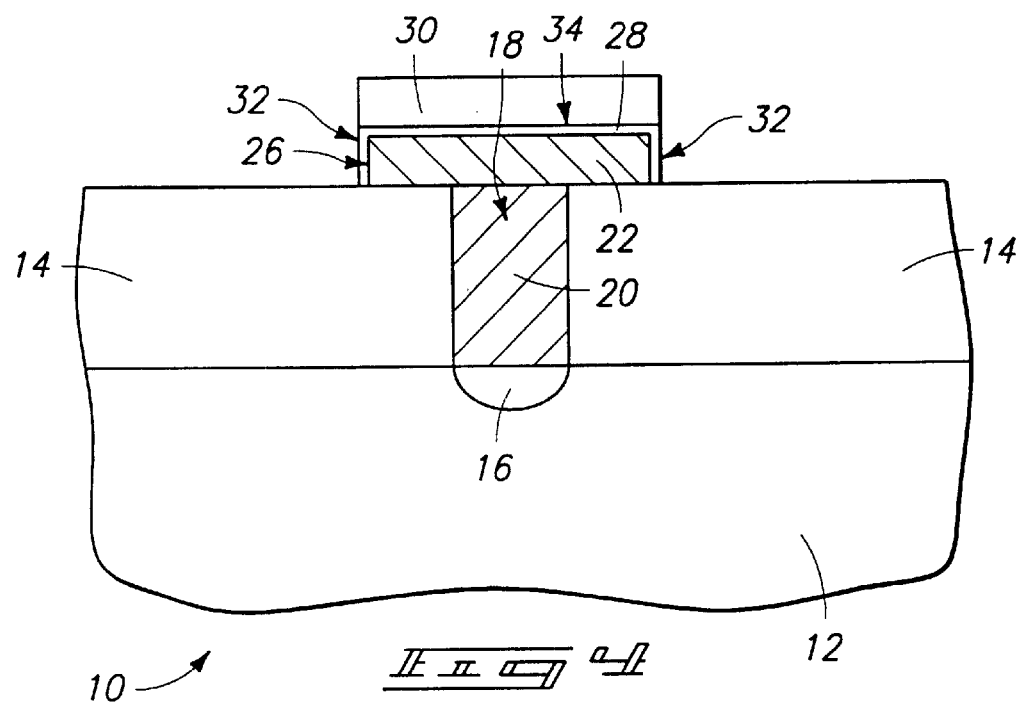
FIG. 4 is a view of the FIG. 1 wafer fragment shown at a processing step subsequent to that of FIG. 3.

FIG. 4 shows fragment 10 after material 28 has been subjected to an etch. Such etch can be a physical etch, and in preferred embodiments consists essentially of a physical etch. After the etch, vertically extending portions 32 of material 28 are along sidewalls of storage node 26, and a horizontally extending portion 34 of material 28 is beneath masking material 30.

Exemplary etch conditions utilize an Ion Beam Etch System reaction chamber, obtained from VEECO of Milpitas, Calif., with an argon-containing plasma, a power of 900 volts, a current of 368 milliamps, and an angle of the wafer to an anode of about 50°.

At least one oxygen-containing gas is flowed through the reaction chamber during the physical etching of material 28. Such oxygen-containing gas can, for example, be selected from the group consisting of $O_3$, $O_2$, $H_2O_2$, and mixtures thereof.

It is found that inclusion of the oxygen-containing gas during the physical etching can improve insulative properties of an etched dielectric layer relative to the properties of a layer etched under similar physical etching conditions, but without the inclusion of the oxygen-containing gas. A possible mechanism by which the oxygen-containing gas can improve properties of physically etched oxygen-containing dielectric materials is that the oxygen-containing gas replaces oxygen displaced from the oxygen-containing dielectric materials by the physical etching conditions. This mechanism could be particularly germane in situations wherein dielectric materials comprising complexes of metal and oxygen are physically etched. If a physical etch process displaces oxygen from a complex of metal and oxygen, then it will effectively leave metal behind. Such metal can be a conductive material and lessen the dielectric properties of the etched metal/oxygen complex. However, if the displaced oxygen is replaced by oxygen from an oxygen-containing gas, the conductive metal can be converted back to an insulative metal/oxygen material.

It is to be understood that the mechanism presented above is provided merely to assist persons in understanding aspects of the present invention, and is not intended to limit the claims which follow. Further, it is to be understood that although the mechanism is discussed with reference to improvement of properties pertaining to metal/oxygen complexes, the invention encompasses embodiments wherein oxygen is flowed into physical etch processes which are utilized for etching materials other than metal/oxygen complexes. Such other materials can comprise, for example, silicon nitride and silicon dioxide.

After the physical etching of material 28 has been stopped, material 28 can be exposed to an additional oxygen treatment to further replace oxygen which may have been lost during the physical etching. Such oxygen treatment can comprise, for example, exposing the etched insulative material 28 to at least one oxygen-containing gas selected from the group consisting of $O_3$, $O_2$, $H_2O_2$, and mixtures thereof, at a temperature of at least about 750° C. A difficulty with such processing is that it can melt particular conductive materials which may be utilized for interconnect 20 or first electrode 26. Accordingly, the exposure of material 28 to temperatures of at least about 750° C. is preferably conducted only when interconnect 20 and electrode 26 are formed of materials which can withstand such high temperature processing.

Figure 5:
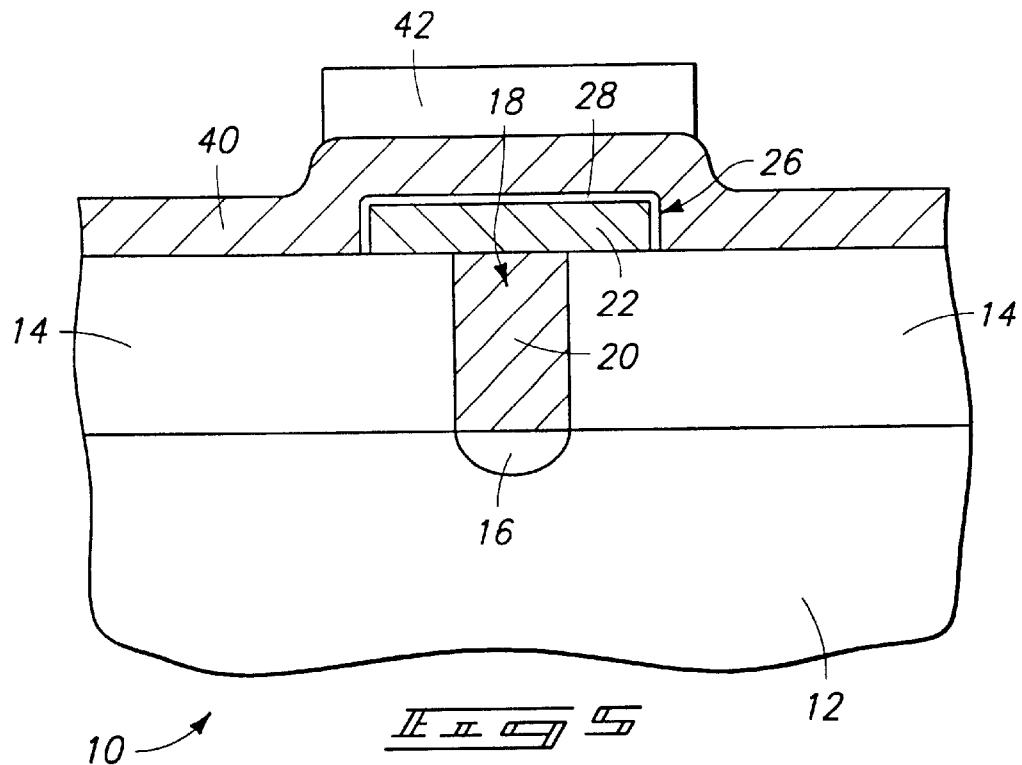
FIG. 5 is a view of the FIG. 1 wafer fragment shown at a processing step subsequent to that of FIG. 4.

Referring to FIG. 5, masking material 30 is removed and a second conductive material 40 is provided over dielectric material 28. Second conductive material 40 is physically separated from first conductive material 22 by dielectric material 28, and can comprise, for example, conductively doped polysilicon or a metal selected from the group consisting of Ti, Pd, Pt and W. Among the materials suitable for conductive material 40 are: TiPt, TiNPt, TiAN—Pt, Ru, $RuO_2$, RuPt, $RuO_2$Pt, W, WPt, WSi, Ti, TiSi, Ta, TaN, TaSi, doped and undoped Poly Si, Al, Pd and Ir.

Figure 6:
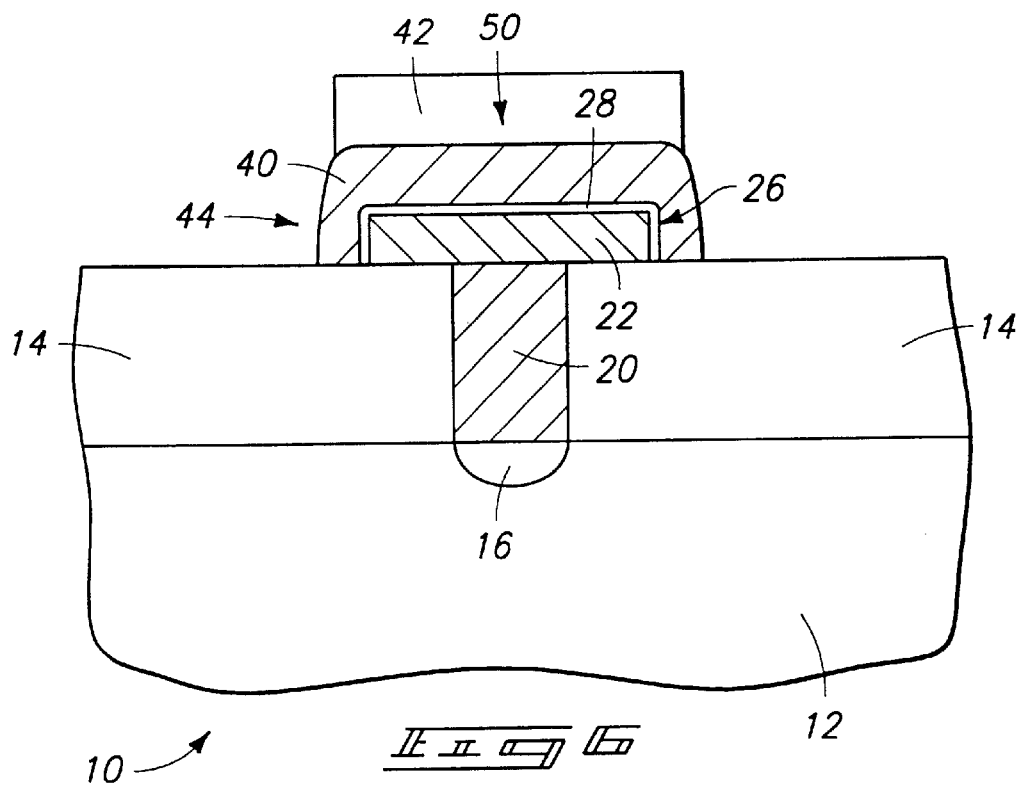
FIG. 6 is a view of the FIG. 1 wafer fragment shown at a processing step subsequent to that of FIG. 5.

A patterned masking material 42 is formed over conductive material 40. Subsequently, material 40 is etched to form a second capacitor electrode 44 as shown in FIG. 6. The etching of material 40 can be accomplished by, for example, a physical etch. First capacitor electrode 26, dielectric material 28 and second capacitor electrode 40 together comprise a capacitor assembly 50.

In subsequent processing (not shown) masking material 42 can be removed and capacitor construction 50 can be electrically connected with other circuitry to form, for example, a dynamic random access memory (DRAM) device.

The processing described above with reference to FIGS. 1–6 is but one embodiment of forming a capacitor construction in accordance with the present invention. Another embodiment method of forming a capacitor construction is described with reference to FIGS. 7 and 8. In referring to FIGS. 7 and 8, similar numbering will be used as was utilized above in describing the embodiment of FIGS. 1–6, with the suffix "a" used to identify structures shown in FIGS. 7 and 8.

Referring to FIG. 7, a semiconductor wafer fragment 10a comprises a substrate 12a having an insulative material 14a formed thereover. An electrical node 16a is provided within substrate 12a, and a conductive material 20a extends through insulative material 14a to connect with electrical node 16a. A first conductive material 22a is formed over insulative material 14a, and subsequently a dielectric material 28a and a second conductive material 40a are formed over first conductive material 22a. Materials 12a, 14a, 20a, 22a, 28a and 40a can comprise identical materials as those discussed above with reference to FIGS. 1–6 for materials 12, 14, 20, 22, 28 and 40, respectively. A patterned masking material 30a is provided over conductive material 40a.

Referring to FIG. 8, materials 22a, 28a and 40a are subjected to an etch. The etch patterns materials 22a, 28a and 40a into a capacitor construction 50a comprising a first capacitor electrode 26a, dielectric material 28a, and a second capacitor electrode 44a.

The etching utilized to pattern materials 22a, 28a and 40a preferably comprises a physical etch and consist essentially of a physical etch. Preferably, an oxygen-containing gas is flowed through a reaction chamber comprising fragment 10a during the physical etching of materials 26a, 28a and 44a. Such oxygen-containing gas can comprise, for example, a gas selected from the group consisting of $O_3$, $O_2$, $H_2O_2$, and mixtures thereof.

After the physical etching conditions utilized to etch materials 26a, 28a and 44a are ceased, dielectric material 28a can be further treated with an additional oxygen treatment. Such oxygen treatment can comprise, for example, exposing material 28a to an oxygen-containing gas selected from the group consisting of $O_3$, $O_2$, $H_2O_2$, and mixtures thereof, and to a temperature of at least about 750° C. A difficulty with such processing is that it can melt particular conductive materials which may be utilized for interconnect 20a, first electrode 26a, or second electrode 44a. Accordingly, the exposure of material 28a to temperatures of at least about 750° C. is preferably conducted only when interconnect 20a and electrodes 26a and 44a are formed of materials which can withstand such high temperature processing.

A difficulty in using physical etching to etch through all of materials 40a, 28a and 22a can result from having material 22a etched after dielectric material 28a. Specifically, conductive fragments displaced by the etching of material 22a can wrap along exposed surfaces of dielectric material 28a and cause a short between materials 22a and 40a. Accordingly, it can be desirable to etch material 22a separately from material 28a. The embodiment of FIGS. 1–6 is one method of accomplishing such separate etching. Another method is described with reference to FIGS. 9 and 10. In referring to FIGS. 9 and 10, similar numbering will be utilized as was used above in describing the embodiment of FIGS. 1–6, with the suffix "b" used to indicate structures shown in FIGS. 9 and 10.

Referring to FIG. 9, a semiconductor wafer fragment 10b is shown at a processing step subsequent to that of FIG. 2. Specifically, the wafer fragment of FIG. 9 comprises a conductive material 22b which has been patterned into a first capacitor electrode 26b. After such patterning, a dielectric material 28b is provided over capacitor electrode 26b, and a conductive material 40b is provided over dielectric material 28b. A masking material 30b is provided over conductive material 40b, and utilized to pattern materials 28b and 40b into the capacitor construction 50b shown in FIG. 10. The patterning of materials 28b and 40b is preferably accomplished with a physical etch in a reaction chamber having an oxygen-containing gas flowing therethrough. The etch converts material 40b into a second capacitor electrode 44b which is separated from first capacitor electrode 26b by dielectric material 28b.

Although methods of the present invention are described above with reference to applications for forming capacitor structures, it is to be understood that the invention can be utilized in other aspects of semiconductor processing. Such other aspects include, for example, etching of dielectric materials for forming insulative caps over wordlines, and etching of dielectric materials for forming insulative structures between electronic devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrical device, comprising:
   forming an insulative first layer, the first layer comprising an insulative material which includes complexes of metal and oxygen;
   forming a second layer over the first layer, the second layer comprising a conductive material;
   exposing the first and second layers to physical etching conditions in a reaction chamber to physically etch the insulative and conductive materials;
   while exposing the first and second layers to the physical etching conditions, flowing at least one oxygen-containing gas through the reaction chamber; and
   wherein the insulative material comprises tantalum pentoxide.

2. A method of forming an electrical device, comprising:

forming an insulative first layer, the first layer comprising an insulative material which includes complexes of metal and oxygen;

forming a second layer over the first layer, the second layer comprising a conductive material;

exposing the first and second layers to physical etching conditions in a reaction chamber to physically etch the insulative and conductive materials;, while exposing the first and second layers to the physical etching conditions, flowing at least one oxygen-containing gas through the reaction chamber; and wherein the insulative material comprises tantalum pentoxide, and the second layer comprises Pt.

3. A method of etching one or more insulative materials which comprise complexes of metal and oxygen, comprising:

exposing the insulative materials comprising complexes of metal and oxygen to etching conditions which consist essentially of physical etching conditions within a reaction chamber;

while exposing the insulative materials to the physical etching conditions, flowing at least one oxygen-containing gas through the reaction chamber;

ceasing the physical etching; and after ceasing the physical etching, exposing the etched insulative materials to an oxygen treatment.

4. The method of claim 3 wherein at least one of the insulative materials comprises one or more of $Ba_{(1-x)}Sr_xO_3$, $PbZr_{(1-x)}Ti_xO_3$, and PZT.

5. The method of claim 3 wherein at least one of the insulative materials comprises one or more of $Sr_{(1-x)}Bi_xTiO_3$, and $PbMg_{(1-x)}Nb_xTiO_3$.

6. The method of claim 3 wherein at least one of the insulative materials comprises one or more of $PbTiO_3$, $CaBi_2Nb_2O_9$, and $SrBi_2Nb_2O_9$.

7. The method of claim 3 wherein at least one of the insulative materials comprises one or more of $BaBi_2Nb_2O_9$, $PbBi_2Nb_2O_9$, $BaBi_2NbTiO_9$.

8. The method of claim 3 wherein at least one of the insulative materials comprises one or more of $BaBi_4Ti_4O_{15}$, $CaBi_2Ta_2O_9$, and $BaBi_2Ta_2O_9$.

9. The method of claim 3 wherein at least one of the insulative materials comprises one or more of $PbBi_2Ta_2O_9$, $Bi_4Ti_3O_{12}$, and $SrBi_4Ti_4O_{15}$.

10. The method of claim 3 wherein at least one of the insulative materials comprises one or more of $BaBi_4Ti_4O_{15}$, $PbBi_4Ti_4O_{15}$, and $(Pb, Sr)Bi_2Nb_2O_9$.

11. The method of claim 3 wherein at least one of the insulative materials comprises one or more of $(Pb, Ba)Bi_2Nb_2O_9$, $(Ba, Ca)Bi_2Nb_2O_9$, and $(Ba, Sr)Bi_2Nb_2O_9$.

12. The method of claim 3 wherein at least one of the insulative materials comprises one or more of $BaBi_2Nb_2O_9$, $Ba_{0.75}Bi_{2.25}Ti_{0.25}Nb_{1.75}O_9$, and $Ba_{0.5}Bi_{2.5}Ti_{0.5}Nb_{1.5}O_9$.

13. The method of claim 3 wherein at least one of the insulative materials comprises one or more of $Ba_{0.25}Bi_{2.75}Ti_{0.75}Nb_{1.25}O_9$, $Bi_3TiNbO_9$, and $SrBi_2Nb_2O_9$.

14. The method of claim 3 wherein at least one of the insulative materials comprises one or more of $Sr_{0.8}Bi_{2.2}Ti_{0.2}Nb_{1.8}O_9$, $Sr_{0.6}Bi_{2.4}Ti_{0.4}Nb_{1.6}O_9$, and $Bi_3TiNbO_9$.

15. The method of claim 3 wherein at least one of the insulative materials comprises one or more of $PbBi_2Nb_2O_9$, $Pb_{0.75}$, and $Bi_{2.25}Ti_{0.25}Nb_{1.75}O_9$.

16. The method of claim 3 wherein at least one of the insulative materials comprises one or more of $Pb_{0.5}Bi_{2.5}Ti_{0.5}Nb_{1.5}O_9$, $Pb_{0.25}Bi_{2.75}Ti_{0.75}Nb_{1.25}O_9$, and $Bi_3TiNbO_9$.

17. The method of claim 3 wherein at least one of the insulative materials comprises one or more of $PbBi_4Ti_4O_{15}$, $Pb_{0.75}Bi_{4.25}Ti_{3.75}Ga_{0.25}O_9$, $Pb_{0.5}Bi_{4.5}Ti_{3.5}Ga_{1.5}O_{1.5}$, and $Bi_5Ti_3GaO_{15}$.

* * * * *

UNITED STATES PATENT AND TRADEMARK OFFICE
CERTIFICATE OF CORRECTION

PATENT NO. : 6,528,429 B2 Page 1 of 1
DATED : March 4, 2003
INVENTOR(S) : Daryl C. New It is certified that error appears in the above-identified patent and that said Letters Patent is hereby corrected as shown below:

Column 1,
Line 39, replace "plasma" with -- plasma. --.

Column 3,
Line 33, delete "so".
Line 38, replace "TiAN-PT" with -- TiAlN-PT --.
Line 61, delete "this".

Column 5,
Line 5, replace "TiAN-PT" with -- TiAlN-PT --.

Column 8,
Line 35, replace "$Pb_{0.75}Bi_{4.25}Ti_{3.75}Ga_{0.25}O_9$" with
-- $Pb_{0.75}Bi_{4.25}Ti_{3.75}Ga_{0.25}O_{15}$ --.
Line 35, replace "$Pb_{0.5}Bi_{4.5}Ti_{3.5}Ga_{1.5}O_{1.5}$" with
-- $Pb_{0.75}Bi_{4.25}Ti_{3.75}Ga_{0.5}O_{1.5}$ --.

Signed and Sealed this

First Day of July, 2003

JAMES E. ROGAN
*Director of the United States Patent and Trademark Office*